(12) United States Patent
Chen et al.

(10) Patent No.: US 11,270,777 B2
(45) Date of Patent: *Mar. 8, 2022

(54) MEMORY SYSTEM CAPABLE OF REDUCING THE READING TIME

(71) Applicant: YANGTZE MEMORY TECHNOLOGIES CO., LTD., Wuhan (CN)

(72) Inventors: Weirong Chen, Wuhan (CN); Qiang Tang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/187,679

(22) Filed: Feb. 26, 2021

(65) Prior Publication Data

US 2021/0183453 A1 Jun. 17, 2021

Related U.S. Application Data

(63) Continuation of application No. 16/436,926, filed on Jun. 11, 2019, now Pat. No. 10,998,059, which is a continuation of application No. PCT/CN2019/085219, filed on Apr. 30, 2019.

(51) Int. Cl.
*G11C 16/30* (2006.01)
*G11C 16/24* (2006.01)
*G11C 16/28* (2006.01)

(52) U.S. Cl.
CPC ............. *G11C 16/30* (2013.01); *G11C 16/24* (2013.01); *G11C 16/28* (2013.01)

(58) Field of Classification Search
CPC ..................................................... G11C 16/30
See application file for complete search history.

(56) References Cited

U.S. PATENT DOCUMENTS

| 8,274,842 | B1 | 9/2012 | Hollmer et al. |
| 9,378,834 | B2 | 6/2016 | Qian |
| 9,530,470 | B2 | 12/2016 | Park |
| 9,589,604 | B1 | 3/2017 | Fritsch |

(Continued)

FOREIGN PATENT DOCUMENTS

| CN | 102013268 A | 4/2011 |
| CN | 102385900 A | 3/2012 |

(Continued)

*Primary Examiner* — Douglas King
(74) *Attorney, Agent, or Firm* — Bayes PLLC

(57) ABSTRACT

A bias circuit includes a charging current reproduce unit, a cell current reproduce unit, a current comparator, and a bit line bias generator. The charging current reproduce unit generates a charging reference voltage according to a charging current flowing through a voltage bias transistor. The cell current reproduce unit generates a cell reference voltage according to a cell current flowing through a common source transistor. The current comparator includes a first current generator for generating a replica charging current according to the charging reference voltage, and a second current generator for generating a replica cell current according to the cell reference voltage. The bit line bias generator generates a bit line bias voltage to control a page buffer for charging a bit line according to a difference between the replica charging current and the replica cell current.

20 Claims, 2 Drawing Sheets

(56) References Cited

U.S. PATENT DOCUMENTS

| | | |
|---|---|---|
| 10,121,548 B2 | 11/2018 | Zhou |
| 2007/0097754 A1 | 5/2007 | Spitz |
| 2013/0223155 A1 | 8/2013 | Oowada |
| 2015/0078098 A1 | 3/2015 | Kwak |
| 2015/0228351 A1 | 8/2015 | Wang |
| 2016/0099068 A1 | 4/2016 | Kwak |
| 2019/0108886 A1 | 4/2019 | Paolini |
| 2019/0279717 A1 | 9/2019 | Sheng |

FOREIGN PATENT DOCUMENTS

| | | |
|---|---|---|
| CN | 102834597 A | 5/2014 |
| CN | 105336369 A | 2/2016 |
| CN | 106611610 A | 5/2017 |
| CN | 106782653 A | 5/2017 |
| CN | 108038057 A | 5/2018 |
| CN | 108074617 A | 5/2018 |
| CN | 108492840 A | 9/2018 |
| CN | 108615541 A | 10/2018 |
| CN | 109658966 A | 4/2019 |
| KR | 10-20120060507 A | 6/2012 |

MEMORY SYSTEM CAPABLE OF REDUCING THE READING TIME

CROSS REFERENCE TO RELATED APPLICATIONS

This application is a continuation of U.S. application Ser. No. 16/436,926, filed Jun. 11, 2019, which is a continuation of PCT Application No. PCT/CN2019/085219 filed on Apr. 30, 2019, both of which are incorporated herein by reference in their entireties.

BACKGROUND

The present disclosure is related to a memory system, and more particularly to a memory system capable of reducing the reading time.

In a memory system, the data stored in the memory cell is usually read by sensing the data voltage on the bit line caused by the memory cell. For example, in a NAND memory read sequence, to read the data stored in a memory cell, the bit line coupled to the memory cell may be pre-charged to a predetermined level first. After the voltage of the bit line has settled, the word line coupled to the memory cell may be raised to cause the memory cell to generate current according to the data stored in the memory cell. If the memory cell has not been programmed, the memory cell may generate a significant current that pulls down the voltage of the bit line. Otherwise, if the memory cell has been programmed, the memory cell will not generate any currents or will only generate insignificant current so the voltage of the bit line will remain at the similar level. Therefore, by sensing the voltage of the bit line, the data stored in the memory cell can be read.

However, since the bit line is resistive and capacitive due to inevitable parasitic resistors and capacitors, the settling time of the bit line will contribute to a significant part of the total reading time. Furthermore, since the resistive and capacitive characteristics are unpredictable and varied with process, the settling time required by different memory cells are also different. Therefore, the worst case settling time is always applied to ensure the sensing accuracy. In addition, in prior art, the bit line is pre-charged with a master-slave transistor controlled by a predetermined voltage. In this case, the charging ability may decrease as the voltage of the bit line approaching to the desired level, which also increases the reading time.

SUMMARY

One embodiment of the present disclosure discloses a memory system. The memory system includes a plurality of memory cells, a voltage bias transistor, a page buffer, a common source transistor, and a bias circuit.

The first memory cells are coupled to a bit line. The voltage bias transistor has a first terminal for receiving a first system voltage, a second terminal, and a control terminal for receiving a first bias voltage.

The page buffer is coupled to the bit line and the second terminal of the voltage bias transistor. The page buffer charges the first bit line to the first system voltage according to a bit line bias voltage during a pre-charge operation, and forms a sensing path from the first bit line to a sensing amplifier during a sense operation.

The common source transistor has a first terminal coupled to the first bit line, a second terminal for receiving a second system voltage smaller than the first system voltage, and a control terminal for receiving a control signal.

The bias circuit includes a charging current reproduce unit, a cell current reproduce unit, a current comparator, and a bit line bias generator. The charging current reproduce unit is coupled to the voltage bias transistor. The charging current reproduce unit generates a charging reference voltage according to a charging current flowing through the voltage bias transistor. The cell current reproduce unit is coupled to the common source transistor. The cell current reproduce unit generates a cell reference voltage according to a cell current flowing through the common source transistor.

The current comparator is coupled to the charging current reproduce unit and the cell current reproduce unit. The current comparator includes a first current generator, and a second current generator. The first current generator generates a replica charging current according to the charging reference voltage, and the second current generator generates a replica cell current according to the cell reference voltage.

The bit line bias generator is coupled to the current comparator and the first page buffer. The bit line bias generator generates the bit line bias voltage according to a difference between the first replica charging current and the first replica cell current.

Another embodiment of the present disclosure discloses a bias circuit. The bias circuit includes a charging current reproduce unit, a cell current reproduce unit, a current comparator, and a bit line bias generator.

The charging current reproduce unit is coupled to a voltage bias transistor, and generates a charging reference voltage according to a charging current flowing through the voltage bias transistor. The cell current reproduce unit is coupled to a common source transistor, and generates a cell reference voltage according to a cell current flowing through the common source transistor.

The current comparator is coupled to the charging current reproduce unit and the cell current reproduce unit. The current comparator includes a first current generator, and a second current generator. The first current generator generates a replica charging current according to the charging reference voltage, and the second current generator generates a replica cell current according to the cell reference voltage.

The bit line bias generator is coupled to the current comparator and a page buffer, and generates a bit line bias voltage to control the page buffer for charging a bit line according to a difference between the replica charging current and the replica cell current.

The plurality of first memory cells are coupled to the bit line, the voltage bias transistor has a first terminal for receiving a first system voltage, a second terminal, and a control terminal for receiving a first bias voltage. The page buffer is coupled to the bit line and the second terminal of the voltage bias transistor, and charges the bit line to the first system voltage according to the bit line bias voltage during a pre-charge operation. The common source transistor has a first terminal coupled to the bit line, a second terminal for receiving a second system voltage smaller than the first system voltage, and a control terminal for receiving a control signal.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
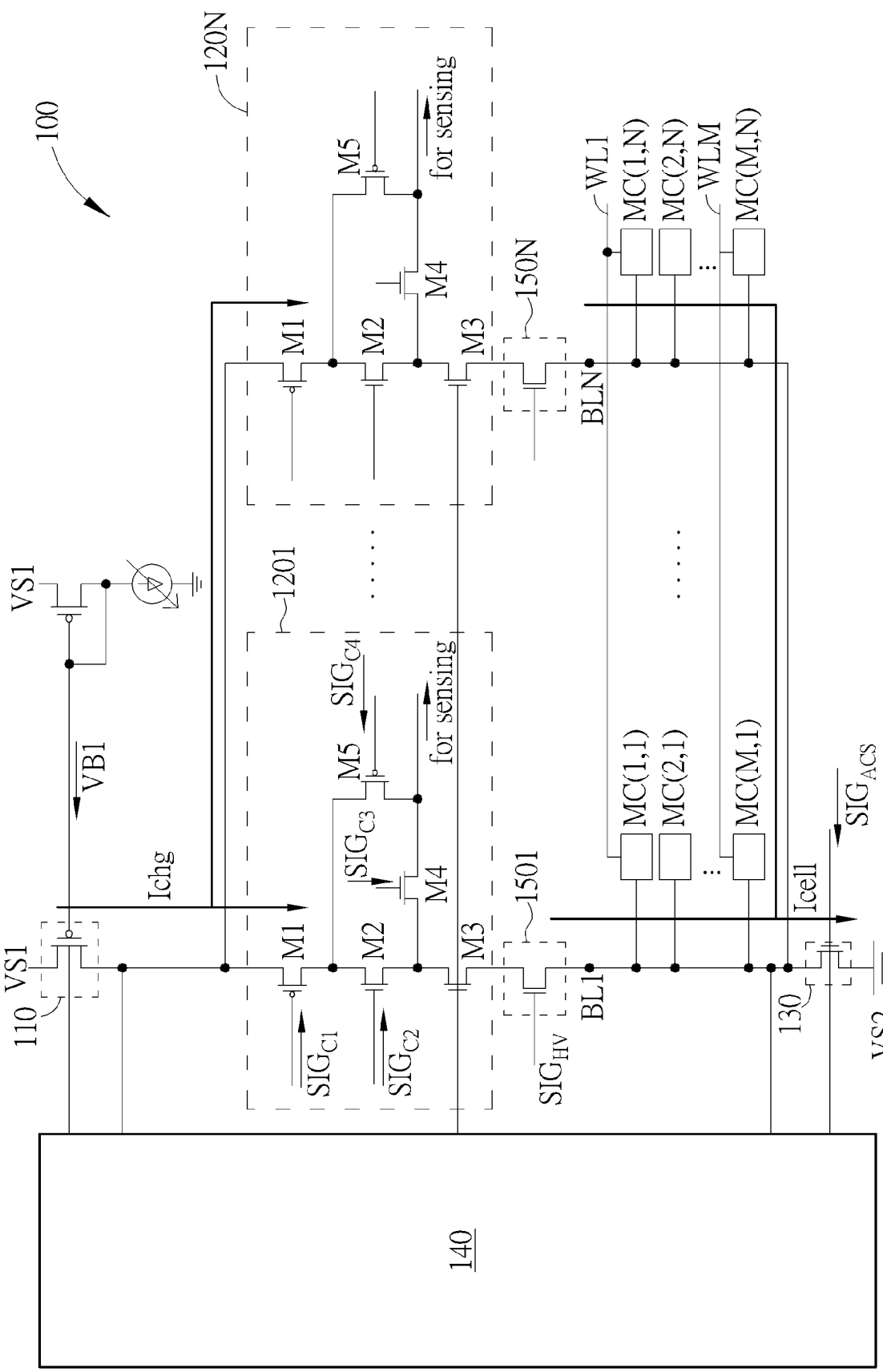
FIG. 1 shows a memory system according to one embodiment of the present disclosure.

FIG. 1 shows a memory system 100 according to one embodiment of the present disclosure. The memory system 100 includes a plurality of memory cells MC(1,1) to MC(M, N), a voltage bias transistor 110, page buffers 1201 to 120N, a common source transistor 130, and a bias circuit 140, where M and N are positive integers.

In FIG. 1, the memory cells MC(1,1) to MC(M,N) are disposed as an array. For example, the memory cells MC(1, 1) to MC(M,1) can be coupled to the bit line BL1, and the memory cells MC(N) to MC(M,N) can be coupled to the bit line BLN. Also, the memory cells MC(1,1) to MC(N) can be coupled to the word line WL1, and the memory cells MC(M,1) to MC(M,N) can be coupled to the word line WLM.

The voltage bias transistor 110 has a first terminal for receiving a first system voltage VS1, a second terminal, and a control terminal for receiving a first bias voltage VB1. The first bias voltage VB1 can turn on the voltage bias transistor 110 to charge the bit lines BL1 to BLN through the page buffers 1201 to 120N.

The page buffers 1201 to 120N can have the same structure. For example, the page buffer 1201 can be coupled to the bit line BL1 and the second terminal of the voltage bias transistor 110. The page buffer 1201 can charge the bit line BL1 to the first system voltage VS1 according to a bit line bias voltage VBLB during the pre-charge operation, and can form a sensing path from the bit line BL1 to a sensing amplifier during the sense operation.

In FIG. 1, the page buffer 1201 includes transistors M1 to M5. The transistor M1 has a first terminal coupled to the second terminal of the voltage bias transistor 110, a second terminal, and a control terminal for receiving a pre-charge control signal $SIG_{C1}$. The transistor M2 has a first terminal coupled to the second terminal of the transistor M1, a second terminal, and a control terminal for receiving a clamping control signal $SIG_{C2}$. The transistor M3 has a first terminal coupled to the second terminal of the second transistor M2, a second terminal coupled to the bit line BL1, and a control terminal for receiving the bit line bias voltage VBLB. The transistor M4 has a first terminal coupled to the second terminal of the transistor M2, a second terminal coupled to the sensing amplifier for sensing, and a control terminal for receiving a sensing control signal $SIG_{C3}$. The transistor M5 has a first terminal coupled to the second terminal of the transistor M1, a second terminal coupled to the second terminal of the transistor M4, and a control terminal for receiving a pre-charge select signal $SIG_{C4}$.

During the pre-charge operation, the transistors M1 and M2 will be turned on, and the transistor M3 will also be turned on to charge the bit line BL1. In some embodiments, the memory system 100 can further include high voltage passing transistors 1501 to 150N, and the page buffers 1201 to 120N can be coupled to the bit lines BL1 to BLN through the high voltage passing transistors 1501 to 150N respectively. In this case, the high voltage passing transistor 1501 will also be turned on by the pass signal $SIG_{HV}$ during the pre-charge operation of the bit line BL1.

Also, during the sense operation, the transistors M1, M2, and M3 may be turned off, and the transistor M4 can be turned on so that the voltage of the bit line BL can be sensed by the sense amplifier. The transistor M5 can be used to select the bit line to be pre-charged according to the requirement.

The common source transistor 130 has a first terminal coupled to the bit lines BL1 to BLN, a second terminal for receiving a second system voltage VS2 smaller than the first system voltage VS1, and a control terminal for receiving a control signal $SIG_{ACS}$.

During the pre-charge operation of the bit line BL1, the voltage bias transistor 110 and the common source transistor 130 can be turned on, and the transistors M1, M2, and M3 of the page buffer 1201 can also be turned on. Therefore, the bit line BL1 can be pre-charged. However, in prior art, as the voltage of the bit line BL1 increases, the gate-to-source voltage applied on the transistor M3 will decrease, thereby weakening the charging ability and increasing the required time for pre-charging. In the memory system 100, to address this issue, the bias circuit 140 can be used to generate and adjust the bit line bias voltage VBLB for controlling the transistor M3 according to the condition of the pre-charging operation.

Figure 2:
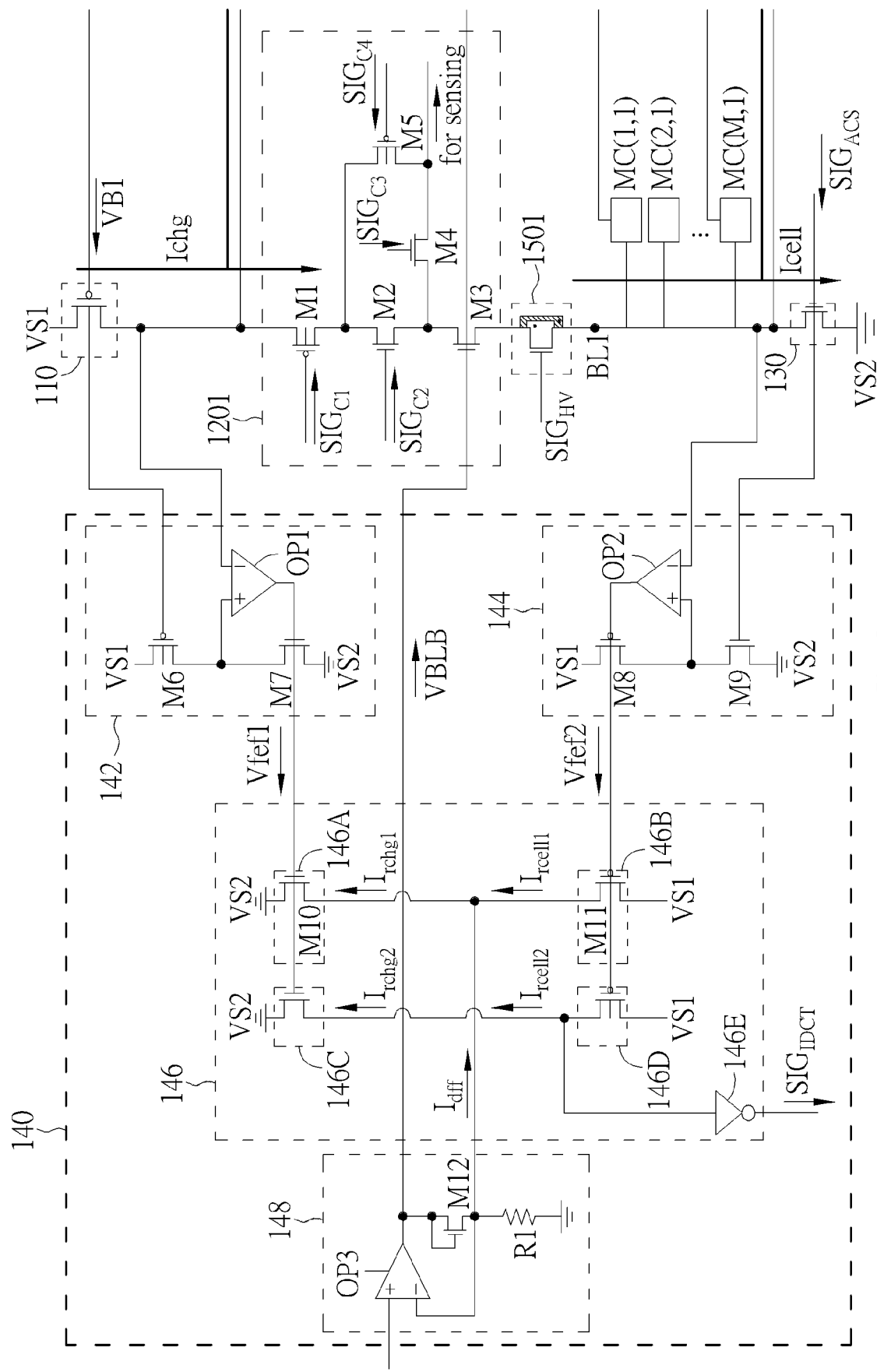
FIG. 2 shows a bias circuit according to one embodiment of the present disclosure.

FIG. 2 further shows the bias circuit 140 according to one embodiment of the present disclosure. The bias circuit 140 includes a charging current reproduce unit 142, a cell current reproduce unit 144, a current comparator 146, and a bit line bias generator 148.

The charging current reproduce unit 142 is coupled to the voltage bias transistor 110, and can generate a charging reference voltage Vref1 according to a charging current Ichg flowing through the voltage bias transistor 110.

The cell current reproduce unit 144 is coupled to the common source transistor 130, and can generate a cell reference voltage Vref2 according to a cell current Icell flowing through the common source transistor 130.

The current comparator 146 is coupled to the charging current reproduce unit 142 and the cell current reproduce unit 144. The current comparator 146 includes a first current generator 146A, and a second current generator 146B. The first current generator 146A can generate a replica charging current $I_{rchg1}$ according to the charging reference voltage Vref1, and the second current generator 146B can generate a replica cell current $I_{rcell1}$ according to the cell reference voltage Vref2.

The bit line bias generator 148 is coupled to the current comparator 146 and the page buffers 1201 to 120N. The bit line bias generator 148 can generate the bit line bias voltage VBLB according to a difference between the replica charging current $I_{rchg1}$ and the replica cell current $I_{rcell1}$.

In some embodiments, part of the charging current Ichg flowing through the voltage bias transistor 110 may flow to the parasitic capacitors on the bit lines BL1 to BLN in the beginning of the pre-charge operation while the rest of the charging current Ichg will flow through the common source transistor 130. Later, when the parasitic capacitors are charged, the charging current Ichg will all flow through the common source transistor 130.

That is, in the beginning of the pre-charge operation, the charging current Ichg would be greater than the cell current Icell, and, thus, the replica charging current $I_{rchg1}$ should be greater than the replica cell current $I_{rcell1}$. In this case, the difference between the replica charging current $I_{rchg1}$ and the replica cell current Irma will cause the bit line bias generator 148 to raise the bit line bias voltage VBLB so the transistor M3 can be fully turned on, thereby increasing the charging ability.

Later, when the parasitic capacitors are charged completely, the replica charging current $I_{rchg1}$ will be substantially equal to the replica cell current $I_{rcell1}$. In this case, it may imply that the bit line BL1 has been charged so the bit line bias generator 148 will keep the bit line bias voltage VBLB, and the sense operation can be performed correspondingly.

In some embodiments, the current comparator 146 can further include a third current generator 146C, a fourth current generator 146D, and an inverter 146E for generating a sensing indication signal $SIG_{IDCT}$. The third current generator 146C can generate a replica charging current $I_{rchg2}$ according to the charging reference voltage Vref1, and the fourth current generator 146D can generate a replica cell current $I_{rcell2}$ according to the cell reference voltage Vref2. The inverter 146E has an input terminal coupled to the third current generator 146C and the fourth current generator 146D, and an output terminal for outputting the sensing indication signal $SIG_{IDCT}$ according to the difference between the replica charging current $I_{rchg2}$ and the replica cell current $I_{rcell2}$. In this case, the sensing indication signal $SIG_{IDCT}$ will be flipped when the difference between the replica charging current $I_{rchg2}$ and the replica cell current $I_{rcell2}$ becomes zero, and the sense operation can be triggered by the flipped sensing indication signal $SIG_{IDCT}$ accordingly.

Since the bit line bias generator 148 can adjust the bit line bias voltage VBLB according to the charging status of the bit lines BL1 to BLN instantly, the charging ability can be maintained to be strong during the pre-charge operation. Also, since the charging status of the bit lines BL1 to BLN can be detected by the difference between the replica charging current $I_{rchg1}$ and the replica cell current $I_{rcell1}$, the pre-charge operation can be terminated and the sense operation can be triggered once the bit lines BL1 to BLN are pre-charged. That is, the pre-charge time can be optimized, and the pre-charge operation can be controlled without being affected by the process variation.

In FIG. 2, the charging current reproduce unit 142 includes transistors M6 and M7, and an operational amplifier OP1. The transistor M6 has a first terminal for receiving the first system voltage VS1, a second terminal, and a control terminal coupled to the control terminal of the voltage bias transistor 110. The operational amplifier OP1 has a positive input terminal coupled to the second terminal of the transistor M6, a negative input terminal coupled to the second terminal of the voltage bias transistor 110, and an output terminal for outputting the charging reference voltage Vref1. The transistor M7 has a first terminal coupled to the second terminal of the transistor M6, a second terminal for receiving the second system voltage VS2, and a control terminal coupled to the output terminal of the operational amplifier OP1.

In this case, the operational amplifier OP1 can ensure the transistor M6 to be biased under the same condition as the voltage bias transistor 110. Therefore, the charging current reproduce unit 142 is able to generate a reproduce current according to the charging current Ichg flowing through the voltage bias transistor 110.

Similarly, the cell current reproduce unit 144 includes transistors M8 and M9, and an operational amplifier OP2. The transistor M8 has a first terminal for receiving the first system voltage VS1, a second terminal, and a control terminal. The operational amplifier OP2 has a positive input terminal coupled to the second terminal of the transistor M8, a negative input terminal coupled to the bit lines BL1 to BLN, and an output terminal coupled to the control terminal of the transistor M8 for outputting the cell reference voltage Vref2. The transistor M9 has a first terminal coupled to the second terminal of the transistor M8, a second terminal for receiving the second system voltage VS2, and a control terminal coupled to the control terminal of the common source transistor 130.

In this case, the operational amplifier OP2 can ensure the transistor M9 to be biased under the same condition as the common source transistor 130. Therefore, the cell current reproduce unit 144 is able to generate a reproduce current according to the cell current Icell flowing through the common source transistor 130.

In FIG. 2, the first current generator 146A includes a transistor M10 having a first terminal, a second terminal for receiving the second system voltage VS2, and a control terminal for receiving the charging reference voltage Vref1. Also, the second current generator 146B includes a transistor M11 having a first terminal for receiving the first system voltage VS1, a second terminal coupled to the first terminal of the transistor M10, and a control terminal for receiving the cell reference voltage Vref2.

In addition, in FIG. 2, the transistors M7 and M10 are N-type transistors while the transistors M8 and M11 are P-type transistors. In this case, the transistor M10 will be biased under the same condition as the transistor M7 with the charging reference voltage Vref1, so the transistor M10 can generate the replica charging current $I_{rchg1}$ by mirroring the current flowing through the transistor M7. Similarly, the transistor M11 will be biased under the same condition as the transistor M8 with the cell reference voltage Vref2, so the transistor M11 can generate the replica cell current $I_{rcell1}$ by mirroring the current flowing through the transistor M8.

In FIG. 2, the bit line bias generator 148 includes an operational amplifier OP3, a transistor M12, and a resistor R1. The operation amplifier OP3 has a positive input terminal for receiving a second bias voltage VB2, a negative input terminal coupled to the first terminal of the transistor M10, and an output terminal for outputting the bit line bias voltage VBLB. The transistor M12 has a first terminal coupled to the output terminal of the operation amplifier OP3, a second terminal coupled to the negative input terminal of the operation amplifier OP3, and a control terminal coupled to the first terminal of the transistor M12. The resistor R1 has a first terminal coupled to the second terminal of the transistor M12, and a second terminal for receiving the second system voltage VS2.

In this case, when the replica charging current $I_{rchg1}$ is greater than the replica cell current $I_{rcell1}$, a differential current $I_{diff}$ will be fed to the bit line bias generator 148, thereby pulling down the voltage of the negative input terminal of the operational amplifier OP3 and raising the bit line bias voltage VBLB.

In some embodiments, the ratio of the size of the transistors M7 and M10 can be selected according to the system requirement to adjust the replica charging current $I_{rchg1}$. However, the ratio of the size of the transistors M8 and M11 should be the same as the ratio of the size of the transistors M7 and M10.

Similarly, the ratio of the size of the transistor M6 and the voltage bias transistor 110 can be selected according to the system requirement, and the ratio of the size of the transistor M6 and the voltage bias transistor 110 should be the same as the ratio of the size of the transistor M9 and the common source transistor 130.

Furthermore, in FIG. 2, the charging current reproduce unit 142 and the cell current reproduce unit 144 can use the operational amplifiers OP1 and OP2 to fix the bias conditions firmly; however, in some other embodiments, the charging current reproduce unit 142 and the cell current reproduce unit 144 may be implemented with other structures, such as the commonly used current mirrors.

Also, in FIG. 1, the bit lines BL1 to BLN can be pre-charged at the same time, however, in some other embodiments, the bit lines BL1 to BLN may also be pre-charged independently with the page buffers 1201 to 120N according to the system requirement.

In summary, the memory system and the bias circuit provided by the embodiments of the present disclosure can adjust the bit line bias voltage according to the charging status of the bit lines instantly, so the charging ability can be maintained to be strong during the pre-charge operation. Also, since the charging status of the bit lines can be detected by the difference between the replica charging current and the replica cell current, the pre-charge time can be optimized, and the pre-charge operation can be controlled without being affected by the process variation.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory system comprising:
   a first transistor having a first terminal configured to receive a first system voltage, a second terminal, and a control terminal, wherein a first page buffer is coupled to the second terminal of the first transistor and to a first bit line of a plurality of first memory cells; and
   a second transistor having a first terminal coupled to the first bit line, a second terminal configured to receive a second system voltage, and a control terminal,
   wherein the control terminal of the first transistor and the control terminal of the second terminal are connected to a circuit configured to compare replicas of currents respectively flowing through the first transistor and the second transistor, to generate a bit line bias voltage based on the comparison, and to provide the bit line bias voltage to the first page buffer.

2. The memory system of claim 1, wherein the circuit comprises a first sub-circuit coupled to the first transistor, and configured to generate a charging reference voltage according to a charging current flowing through the first transistor.

3. The memory system of claim 2, wherein the circuit comprises a second sub-circuit coupled to the second transistor, and configured to generate a cell reference voltage according to a cell current flowing through the second transistor.

4. The memory system of claim 3, wherein the circuit comprises a third sub-circuit
   a current comparator coupled to the first sub-circuit and the second sub-circuit.

5. The memory system of claim 4, wherein the third sub-circuit further comprises:
   a first current generator configured to generate a first replica charging current according to the charging reference voltage; and
   a second current generator configured to generate a first replica cell current according to the cell reference voltage,
   wherein the current comparator is configured to compare the first replica charging current and the first replica cell current.

6. The memory system of claim 5, wherein the circuit further comprises:
   a voltage generator configured to generate the bit line bias voltage, wherein the voltage generator is coupled to the current comparator and the first page buffer, and wherein the voltage generator is configured to generate the bit line bias voltage according to a difference between the first replica charging current and the first replica cell current.

7. The memory system of claim 6, wherein: the voltage generator is configured to raise the bit line bias voltage when the first replica charging current is greater than the first replica cell current; and the voltage generator is configured to keep the bit line bias voltage when the first replica charging current is substantially equal to the first replica cell current.

8. A method of bit line biasing, comprising:
   reproducing, with a first circuit, a first current of a first transistor having a first terminal configured to receive a first system voltage, a second terminal, and a control terminal, wherein a first page buffer is coupled to the second terminal of the first transistor and to a first bit line of a plurality of first memory cells;
   reproducing, with a second circuit, a second current of a second transistor having a first terminal coupled to the first bit line, a second terminal configured to receive a second system voltage, and a control terminal,
   comparing, with a third circuit, the first current and the second current;
   generating, with a fourth circuit, a bit line bias voltage based on the comparison; and
   providing, by the fourth circuit, the bit line bias voltage to the first page buffer.

9. The method of claim 8, wherein the reproducing the first current comprises generating a charging reference voltage according to a charging current flowing through the first transistor.

10. The method of claim 9, wherein the reproducing the second current comprises generating a cell reference voltage according to a cell current flowing through the second transistor.

11. The method of claim 10, further comprising:
    generating a first replica charging current according to the charging reference voltage.

12. The method of claim 11, further comprising:
    generating a first replica cell current according to the cell reference voltage.

13. The method of claim 12, wherein the comparing the first current and the second current comprises comparing the first replica charging current with the first replica cell current.

14. The method of claim 13, wherein the generating the bit line bias voltage comprises raising the bit line bias voltage when the first replica charging current is greater than the first replica cell current and the generating the bit line bias voltage comprises keeping the bit line bias voltage when the first replica charging current is substantially equal to the first replica cell current.

15. A system of bit line biasing, comprising:
    a first circuit configured to reproduce a first current of a first transistor having a first terminal configured to receive a first system voltage, a second terminal, and a control terminal, wherein a first page buffer is coupled to the second terminal of the first transistor and to a first bit line of a plurality of first memory cells;

a second circuit configured to reproduce a second current of a second transistor having a first terminal coupled to the first bit line, a second terminal configured to receive a second system voltage, and a control terminal;

a third circuit coupled to the first circuit and the second circuit and configured to compare the first current and the second current; and a fourth circuit, coupled to the third circuit, and configured to generate a bit line bias voltage based on the comparison and to provide the bit line bias voltage to the first page buffer.

16. The system of claim 15, wherein first circuit is configured to reproduce the first current by generating a charging reference voltage according to a charging current flowing through the first transistor.

17. The system of claim 16, wherein the second circuit is configured to reproduce the second current by generating a cell reference voltage according to a cell current flowing through the second transistor.

18. The system of claim 17, wherein the third circuit is further configured to generate a first replica charging current according to the charging reference voltage.

19. The system of claim 18, wherein the third circuit is further configured to generate a first replica cell current according to the cell reference voltage.

20. The system of claim 19, wherein the fourth circuit is configured to raise the bit line bias voltage when the first replica charging current is greater than the first replica cell current and to keep the bit line bias voltage when the first replica charging current is substantially equal to the first replica cell current.

* * * * *